(12) United States Patent
Stähli n et al.

(10) Patent No.: US 10,055,517 B2
(45) Date of Patent: Aug. 21, 2018

(54) METHOD AND SYSTEM FOR MERGING AMBIENT SENSOR DATA WITH COMMUNICATION DATA, AND USE OF THE SYSTEM

(71) Applicant: Continental Teves AG & Co. oHG, Frankfurt (DE)

(72) Inventors: Ulrich Stähli n, Eschborn (DE); Richard Scherping, Liederbach am Taunus (DE); Thomas Grotendorst, Eschborn (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 491 days.

(21) Appl. No.: 14/438,271

(22) PCT Filed: Oct. 25, 2013

(86) PCT No.: PCT/EP2013/072456
§ 371 (c)(1),
(2) Date: Apr. 24, 2015

(87) PCT Pub. No.: WO2014/064280
PCT Pub. Date: May 1, 2014

(65) Prior Publication Data
US 2015/0286754 A1 Oct. 8, 2015

(30) Foreign Application Priority Data
Oct. 26, 2012 (DE) .................. 10 2012 219 637

(51) Int. Cl.
*G06G 7/48* (2006.01)
*G06F 17/50* (2006.01)
(Continued)

(52) U.S. Cl.
CPC ......... *G06F 17/5009* (2013.01); *G08G 1/163* (2013.01); *G08G 1/166* (2013.01);
(Continued)

(58) Field of Classification Search
None
See application file for complete search history.

(56) References Cited

U.S. PATENT DOCUMENTS 6,161,071 A * 12/2000 Shuman ............ B60K 31/0008
340/436
8,451,812 B2 5/2013 Stahlin
(Continued)

FOREIGN PATENT DOCUMENTS

DE 10334203 3/2005
DE 102007058192 6/2009
(Continued)

OTHER PUBLICATIONS

Festag et al. Vehicle-To-Vehicle and Road-Side Sensor Communication for Enhaced Road Safety Proceedings of ITS World Congress and Exhibition, Nov. 2008.*
(Continued)

*Primary Examiner* — Omar F Fernandez Rivas
*Assistant Examiner* — Cuong V Luu
(74) *Attorney, Agent, or Firm* — RatnerPrestia

(57) ABSTRACT

A method for merging environment sensor data with communication data, wherein the environment sensor data is detected by at least one environment sensor and wherein the communication data is contained in vehicle-to-X messages which are received by vehicle-to-X communication. The communication data selected by pre-processing is fed directly to the sensor data merging process, wherein the sensor data merging process merges the selected communication data with environment sensor data to form an envi- (Continued)

ronment model. A corresponding system and a usage of the system are also disclosed.

14 Claims, 2 Drawing Sheets

(51) Int. Cl.
*H04W 4/80* (2018.01)
*H04L 29/08* (2006.01)
*H04L 29/06* (2006.01)
*G08G 1/16* (2006.01)
*G06K 9/62* (2006.01)

(52) U.S. Cl.
CPC .............. *H04L 67/12* (2013.01); *H04L 69/22* (2013.01); *H04W 4/80* (2018.02); *G06K 9/6288* (2013.01)

(56) References Cited

U.S. PATENT DOCUMENTS

| 8,983,706 | B2 | 3/2015 | Hartmann |
| 9,536,197 | B1* | 1/2017 | Penilla ................... G06N 5/025 |
| 2004/0083035 | A1 | 4/2004 | Ellis |
| 2007/0016372 | A1 | 1/2007 | Browne |
| 2008/0027591 | A1* | 1/2008 | Lenser ................. G05D 1/0274 701/2 |
| 2010/0198513 | A1* | 8/2010 | Zeng ..................... B60W 40/02 701/300 |
| 2010/0253594 | A1* | 10/2010 | Szczerba ............... G01S 13/723 345/7 |
| 2010/0253597 | A1* | 10/2010 | Seder ........................ B60R 1/00 345/7 |
| 2010/0303048 | A1* | 12/2010 | Stahlin .................. H04W 84/12 370/338 |
| 2011/0098877 | A1* | 4/2011 | Stahlin ................... G08G 1/161 701/31.4 |
| 2012/0191271 | A1 | 7/2012 | Stuebing |
| 2012/0296567 | A1* | 11/2012 | Breed .................... G01C 21/26 701/468 |
| 2017/0103401 | A1* | 4/2017 | Martin ................. G06Q 30/018 |

FOREIGN PATENT DOCUMENTS

| DE | 102008060231 | 6/2009 |
| DE | 102010002092 | 12/2010 |
| DE | 102011009209 | 7/2012 |
| DE | 102012203182 | 9/2012 |

OTHER PUBLICATIONS

Christian Welb V2X Communication in Europe—From Research Project Towards Standardization and Field Testing of Vehicle Communication Technology Computer Networks 55, 2011, pp. 3103-3119.*
Antipolis, S., "Intelligent Transport Systems (ITS); Vehicular Communications; Basic Set of Applications; Part 3: Specifications of Decentralized Environmental Notification Basic Service," Technical Specification, European Telecommunications Standards Institute (ETSI), Sep. 1, 2010, pp. 1-46, vol. ITS WG1, No. V1.1.1.
German Search Report for German Application No. 10 2012 219 637.4 dated Dec. 12, 2012.
International Search Report for International Application No. PCT/EP2013/072456 dated Feb. 3, 2014.
Le, L. et al., "Vehicular wireless short-range communication for improving intersection safety," Nov. 1, 2009, pp. 104-110, vol. 47, No. 11, IEEE Communications Magazine, IEEE Service Center, Piscataway, NJ.
Rauch, A. et al., "Analysis of V2X communication parameters for the development of a fusion architecture for cooperative perception systems," Jun. 5-9, 2011, pp. 685-690, 2011 IEEE Intelligent Vehicles Symposium (IV).
Sander, O. et al., "Design of a vehicle-to-vehicle communication system on reconfigurable hardware," Dec. 9, 2009, pp. 14-21, Field-Programmable Technology, 2009, International Conference on IEEE, Piscataway, NJ.

* cited by examiner

US 10,055,517 B2

METHOD AND SYSTEM FOR MERGING AMBIENT SENSOR DATA WITH COMMUNICATION DATA, AND USE OF THE SYSTEM

CROSS REFERENCE TO RELATED APPLICATIONS

This application is the U.S. National Phase Application of PCT International Application No. PCT/EP2013/072456, filed Oct. 25, 2013, which claims priority to German Patent Application No. 10 2012 219 637.4, filed Oct. 26, 2012, the contents of such applications being incorporated by reference herein.

FIELD OF THE INVENTION

The invention relates to a method for merging ambient sensor data with communication data to a system for merging ambient sensor data with communication data and to the use of the system.

BACKGROUND OF THE INVENTION

The prior art already discloses what is known as vehicle-to-X communication (vehicle-2-X or V2X). This is currently in an advanced state of development and is the subject matter of various standardization methods, including at the European Telecommunications Standards Institute (ETSI). Although various methods for ambient sensor data merging are also already known in the prior art, they are nevertheless still in development. Both current V2X architectures or V2X data structures or V2X data bodies, which are also known by the term Intelligent Transportation Systems (ITS), and ambient sensor data merging normally require a database that collects and holds information from the respectively received messages or the captured ambient sensor data. In this case, the known and standardized V2X message types are status messages (Cooperative Awareness Messages, CAMs) and event-based messages (Decentralized Environmental Notification Messages, DENMs) that are sent, e.g. periodically, by ITS communication subscribers. Furthermore, there are further, special message types in existence.

In this connection, DE 10 2010 002 092 A1, which is incorporated by reference describes data preprocessing for received vehicle-to-X messages that precedes forwarding of the messages to the associated applications and systems in the vehicle and the processing of said messages by these applications and systems. In this case, the data preprocessing can comprise checking a safety level for the message and additionally performing data reduction. The data reduction prompts information about particular objects or situations to be masked out and accordingly not forwarded and processed. Thus, information about objects that are too great a distance from the receiving vehicle or information about objects that the vehicle reaches only after a particular period of time, for example, is ignored. Similarly, a large number of objects close by with fundamentally the same behavior in relation to a situation are combined, e.g. to produce a queue. It is also possible to take exclusive account of objects that are in the envisaged channel of movement of the vehicle. This allows a distinct reduction in the volume of data that is to be processed by the individual applications.

DE 10 2008 060 231 A1, which is incorporated by reference discloses a method for selecting different data transmitted by means of vehicle-to-X communication. Using a data frame, the received data are distinguished by a data filter in the reception apparatus and forwarded to a driver assistance system or an entertainment device, for example. This allows the received data to be sorted before they are actually processed. The data are transmitted by using transmission and reception devices based on the WLAN standards 802.11a/b/g/n for 2.4 GHz or 5.9 GHz or the WLAN standard 802.11p for 5.9 GHz. In order to transmit the data redundantly and to increase the reliability of the transmission, simultaneous sending on both WLAN frequency ranges is also possible.

DE 10 2007 058 192 A1, which is incorporated by reference discloses merging of different ambient sensors, such as radar sensors, camera sensors, lidar sensors and also a telematic system, which in this case is likewise understood to be an ambient sensor. A central controller is used to check the respective non-redundantly captured information from a single sensor by analytically comparing it with information from another sensor. In this way, it may be possible to set up information redundancy, which forms the basis for safety-relevant action in the vehicle control.

The methods and apparatuses known from the prior art have disadvantages, however, insofar as the computationally involved checking of the data authenticity and the subsequent evaluation of received vehicle-to-X messages result in latencies if the vehicle-to-X messages or the data contained in the vehicle-to-X messages are intended to be merged together with ambient sensor data to produce an environment model. These latencies mean that the environment model is only ever up to date after a certain delay. Particularly if information from the environment model is used as a basis for warning the driver or even for autonomous control action, the cited latencies or delays can further accentuate an existing critical situation.

SUMMARY OF THE INVENTION

An aspect of the present invention aims to avoid the disadvantages that prevail in the prior art.

According to a method of the invention for merging ambient sensor data with communication data, the ambient sensor data are captured by means of at least one ambient sensor, the communication data that vehicle-to-X messages contain are received by means of vehicle-to-X communication means. The method is distinguished in that communication data selected by the preprocessing process are supplied directly to a sensor data merging process, wherein the sensor data merging process merges the selected communication data with ambient sensor data to produce an environment model.

This results in the advantage that the communication data that are relevant to an environment model are not first subjected to computation-intensive examination, sorting and preliminary evaluation but rather are supplied directly to the sensor data merging process. This avoids latencies and delays that usually arise according to the prior art.

An aspect of the invention is thus concerned with the integration of the ITS architecture into vehicles that already have safety applications (for example emergency braking assistant and lane departure warning system) and can additionally resort to ambient sensor data merging (for example using a radar and a camera).

Within the data structure, or the data architecture or the data body of what is known as the communication stack in the ITS architecture, a preprocessing process (Preprocessing) is provided that forwards received vehicle-to-X messages or communication data for processing within the sensor data merging process if the communication data appear suitable therefor and are selected. In this case, this preprocessing process is arranged upstream of a data management process (Facilities) as seen in the direction of reception of the data.

For the preprocessing process, it is possible to use methods that are already known to a person skilled in the art, for example. A further and new option for filtering within the preprocessing process is simple filtering according to message types, with particular message types always being forwarded to the ambient sensor data merging process and other message types being forwarded only to the data management process.

The inventive tapping-off of the vehicle-to-X messages that are relevant to the sensor data merging process before the data management process therefore avoids the otherwise usual latencies that would arise if the sensor data merging process were for its part to make queries to the data management process.

The terms "querying of data" and "forwarding of data" are intended to be understood synonymously within the context of the invention, since in each case they describe the transport of data from a first process to a subsequent process. Whether this involves querying by the subsequent process or forwarding by the first process is irrelevant and equivalent within the context of the invention.

Preferably, the selected communication data are provided with a data marking by the preprocessing process. This results in the advantage that communication data that are forwarded by the preprocessing process both to the data management process and to the sensor data merging process are identifiable as being present in redundant form.

In addition, it is preferred that at least one component of the communication data is supplied both to the sensor data merging process and to a data management process by the preprocessing process.

Particularly preferably, more than two outputs for the data management process are actually realized. By way of example, in addition to a sensor data merging process for objects, a module for identifying road signs and traffic lights can be operated or grid-based open space identification can be supplied with data by filtering out and forwarding V2X messages that are relevant thereto. A further option is filtering according to data that are relevant to a visual presentation for the driver.

The reason is that the communication data are particularly preferably additionally forwarded to the data management process, at least provided that there are communication-based application processes that use them, instead of resorting exclusively to ambient sensor data. The remainder of the received vehicle-to-X messages or communication data, which are not denoted as irrelevant by the preprocessing process, are then forwarded to the data management process.

A preferred design, according to the invention, for the preprocessing process therefore allows simple and efficient integration of directly forwarded vehicle-to-X messages into the existing sensor data merging process. If safety-relevant data or vehicle-to-X messages are actually queried before the data management process, it is possible for the current development aims of the functions of the data management process, which are potentially very intensive in terms of computation time, to be achieved in the hardware and in the software with relatively low ASIL (Automotive Safety Integrity Level) requirements. This allows a reduction in the computation capacity required and hence in manufacturing costs.

Expediently, heterogeneous application processes that receive information forwarded both by the sensor data merging process and by the data management process identify redundantly forwarded information by means of the data marking. This also allows the unnecessarily duplicate holding of data to be avoided.

Advantageously, different data formats of received vehicle-to-X messages are standardized in a data arrival process. This results in the advantage that the further processing of the vehicle-to-X messages or of the communication data is simplified for the subsequent processes.

With alternative preference, it is also possible for the standardization of the data formats—depending on the transmission paths used—not be effected until in the preprocessing process, since different transmission protocols (e.g. TCP/IP in mobile radio versus GeoRouting in the case of WLAN) that promote such an approach may be used.

In addition, it is preferred that the communication data are combined to produce a joint data stream by means of the data arrival process and/or the preprocessing process. This simplifies the subsequent processing even further.

Furthermore, it is advantageous that at least one preprocessing stage, which is affiliated to the data arrival process and an ambient data capture process, is used to effect first filtering of the ambient sensor data and the communication data. This first filtering, which precedes the preprocessing process according to the invention, can filter out already irrelevant communication data and irrelevant ambient sensor data before subsequent processing. This means that less computation power is needed for the subsequent processes.

The forwarding of the communication data or of the vehicle-to-X messages to the sensor data merging process early on in the procedure results in the additional advantage that the processes provided according to the invention can be distributed to different controllers in the vehicle. This simplifies the implementation of the method according to the invention, since it is possible to resort to already existent electronic arithmetic and logic units in the controller.

Given the preferred design, according to the invention, of the data bodies for communication with other processes, the sensor data merging process can resort to known and proven communication interfaces such as CAN, since the preprocessing process and possibly further preprocessing stages reduce(s) the required data bandwidth.

Depending on the split of the different processes according to the invention over one or more different controllers, the preprocessing process can be linked either to the network and transport process at process level or to the data management process. Alternatively, the preprocessing process can also be incorporated individually via existing interfaces between these processes.

It is expedient that the preprocessing process is used to effect second filtering of the communication data. This second filtering allows further communication data that are not needed to be filtered out. Hence, computation power can again be saved in subsequent processes.

Preferably, the communication data selected by means of the preprocessing process are selected on the basis of their header data elements. The header data elements, which are also known as "header information", contain a series of information, in particular unencrypted information, as standard that allows the vehicle-to-X messages or the communication data to be assessed and rated in a meaningful manner. Examples of this information are the position of the sender, the speed of the sender and the direction of movement of the sender, for example.

In addition, it is preferred that the preprocessing process and the at least one preprocessing stage are used to categorize the ambient sensor data and the communication data into one of the categories critical, relevant and irrelevant. This categorization simplifies the further processing and, in particular, allows the communication data or the processing thereof to be prioritized.

In particular, it is preferred that ambient sensor data and communication data categorized as critical are edited and/or forwarded preferentially.

In addition, it is particularly preferred that ambient sensor data and communication data categorized as irrelevant are rejected.

Advantageously, the vehicle-to-X communication means exchange the vehicle-to-X messages using at least one of the following connection types:

WLAN connection, particularly based on IEEE 802.11p, WiFi Direct,
ISM (Industrial, Scientific, Medical band) connection, particularly using a closing apparatus with radio connection capability,
Bluetooth connection
ZigBee connection
UWB (Ultra Wide Band) connection,
WiMax (Worldwide Interoperability for Microwave Access),
remote keyless entry connection,
closing apparatus with radio connection capability,
mobile radio connection, particularly GSM, GPRS, EDGE, UMTS and/or LTE connections, and
infrared connection.

In this case, the set connection types afford different advantages, depending on the type, wavelength and the data protocol used. Thus, some of the cited connection types allow a comparatively high data transmission rate and comparatively fast connection setup, for example, whereas others are extremely well suited to data transmission around visual obstacles. The combination and simultaneous or parallel use of a plurality of these connection types result in further advantages, since this also allows compensation for disadvantages of individual connection types.

Expediently, the ambient sensors are one or more elements from the group
radar sensor,
optical camera sensor,
lidar sensor,
laser sensor,
ultrasonic sensor
ESP sensor,
ABS sensor and
inclination sensor.

The cited sensors are sensor types that are typically used in the motor vehicle sector and that essentially allow comprehensive capture and identification of the vehicle environment and the vehicle condition. At the present time, a large number of vehicles are already equipped with a plurality of sensors of the cited types as standard, and this number will in all probability increase further in future. The additional equipment complexity for implementing the method according to the invention in a motor vehicle is therefore low.

An aspect of the invention additionally relates to a system for merging ambient sensor data with communication data that comprises at least one electronic arithmetic and logic unit and also ambient sensors and vehicle-to-X communication means. The system is distinguished in that it carries out the method according to the invention. This results in the advantages already described.

An aspect of the invention furthermore relates to use of the system in a motor vehicle.

BRIEF DESCRIPTION OF THE DRAWINGS

Further preferred embodiments will emerge from the sub claims and the description below of an exemplary embodiment with reference to figures, in which

DETAILED DESCRIPTION OF THE PREFERRED EMBODIMENTS

Figure 1:
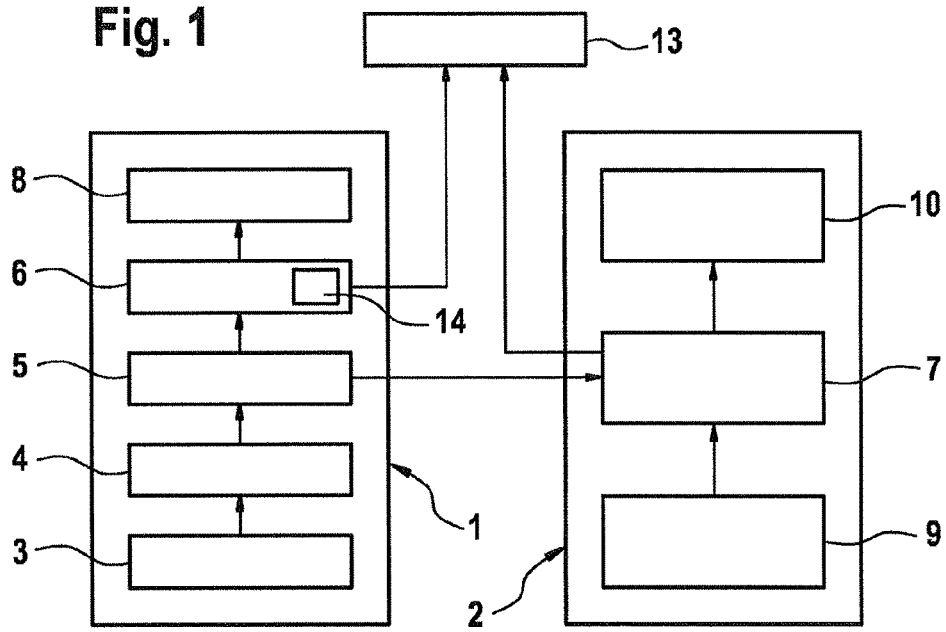
FIGS. 1 and 2 show a possible data structures that allows the method according to aspects of the invention to be carried out.

FIG. 1 shows communication data body 1 and ambient sensor data body 2. Communication data body 1 initially comprises data arrival process 3, by means of which wirelessly received vehicle-to-X messages are identified as such and captured. According to the example, the vehicle-to-X messages are received by means of mobile radio and WLAN. Data arrival process 3 forwards the captured vehicle-to-X messages to preprocessing process 5 via network and transport process 4. Preprocessing process 5 sorts the captured vehicle-to-X messages and forwards them, according to their relevance, or their opportunities for use, to data management process 6 or sensor data merging process 7. Since preprocessing process 5 already forwards vehicle-to-X messages that are relevant to sensor data merging process 7 directly to sensor data merging process 7, these vehicle-to-X messages do not need to be processed in data management process 6. This significantly reduces the computation power that is usually required vis-à-vis the prior art for the data management process. Nevertheless, it is also still possible for vehicle-to-X messages that have been forwarded to sensor data merging process 7 to be simultaneously also forwarded to data management process 6 provided that these vehicle-to-X messages are also relevant to other applications or processes. In addition, the captured vehicle-to-X messages are categorized by preprocessing process 5 into one of the three categories "critical" "relevant" and "irrelevant", vehicle-to-X messages that are categorized as "irrelevant" being irrelevant to safety systems and safety applications. Data management process 6 for its part comprises dynamic mapping process 14, which collects the data contents from the captured vehicle-to-X messages, sorts them and possibly forwards them to appropriate communication-based application processes 8. The element denoted by the reference symbol 8 in FIG. 1 can comprise a multiplicity of different application processes.

Data body 2 comprises ambient data capture process 9, which uses a multiplicity of ambient sensors to capture ambient sensor data. These ambient sensor data are forwarded to sensor data merging process 7, where they are merged with other ambient sensor data and the vehicle-to-X messages forwarded by preprocessing process 5 to produce an environment model. Finally, sensor data merging process 7 forwards the merged data to different sensor-data-based application processes 10, such as an autonomous emergency braking process.

Outside data body 1 and data body 2, there are furthermore heterogeneous application processes 13 provided that receive both communication data forwarded from data management process 6 and ambient sensor data forwarded from sensor data merging process 7. According to the example, heterogeneous application processes 13 are a traffic light phase assistant, inter alia, which captures a condition information item from a set of traffic lights both via vehicle-to-X communication and via a camera sensor.

Figure 2:
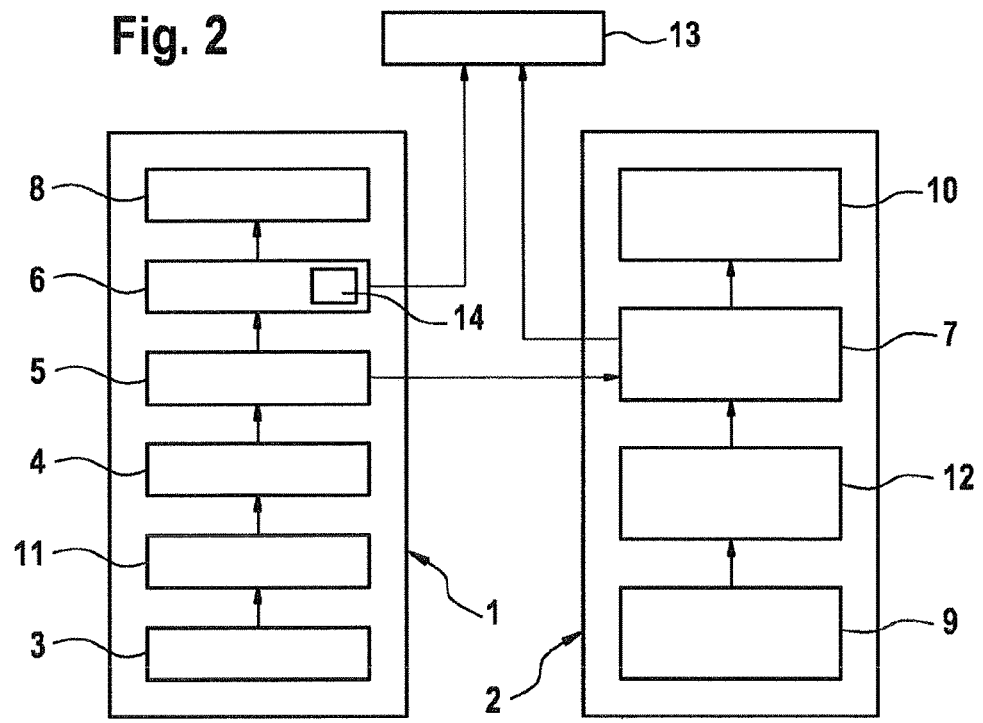

FIG. 2 shows a data structure that is similar to the data structure shown in FIG. 1 but that differs therefrom by virtue of preprocessing stages 11 and 12. In this case, preprocessing stage 11 is affiliated to data arrival process 3 and preprocessing stage 12 is affiliated to ambient data capture process 9. Preprocessing stages 11 and 12 classify the captured vehicle-to-X messages and the captured ambient sensor data and filter out irrelevant data or information before these data or this information is/are forwarded to subsequent processes, as a result of which the necessary computation power for the subsequent processes can have smaller proportions in comparison with the prior art. Therefore, the data structure according to the invention can be implemented and achieved comparatively simply and inexpensively.

Figure 3:
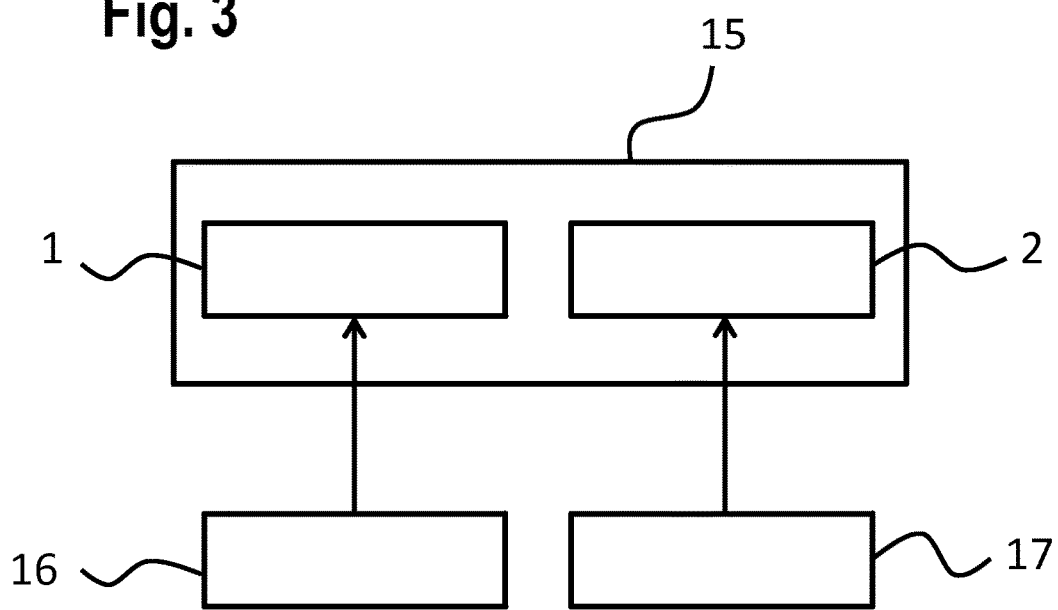
FIG. 3 is a block diagram of an exemplary embodiment of the present invention.

FIG. 3 shows an electronic arithmetic and logic unit 15 which contains communication data body 1 and ambient sensor data body 2. Vehicle-to-X communication means 16 provide data for communication data body 1. Ambient sensors provide data for sensor data body 2.

Various options for the processing of incoming vehicle-to-X messages are described below by way of example:
  if a plurality of transmission channels with different data arrival processes are used, the data formats are standardized and if need be the communication data or the vehicle-to-X messages are combined as part of the actual data arrival process.
  classification based on what are known as header data (header) in the vehicle-to-X messages filters out messages that are potentially relevant to the sensor data merging process in a manner that is efficient in terms of computation time. Said messages are primarily CAMs, whose statements relating to position, direction of movement and speed allow relevance to be determined in a simple manner.
  if a vehicle-to-X message contains data that are relevant to the sensor data merging process and additionally further data, describing the same object, which cannot be processed by the sensor data merging process, however, the respective information is forwarded to the data management process and to the sensor data merging process in parallel. An explicit data marking that is allocated at that time ensures than an application that accesses both sources (data management process and sensor data merging process) for particular functions can establish that one and the same described object is involved.

The invention claimed is:

1. A method for merging, by a controller of a vehicle sensor system, ambient sensor data with communication data, the method comprising:
  capturing, by at least one ambient sensor in the vehicle, ambient sensor data;
  receiving, by a vehicle-to-X communication means in the vehicle, communication data;
  selecting, by the controller of the vehicle sensor system, during a preprocessing process:
    a first portion of the communication data, and supplying the first portion of the communication data directly to a sensor data merging process that merges the first portion of the communication data with ambient sensor data to produce an environment model, and
    a second portion of the communication data, and supplying the second portion of the communication data to a data management process; and
  wherein the selected communication data including at least one of the first portion or the second portion are provided with a data marking by the preprocessing process,
  wherein heterogeneous application processes that receive information forwarded both by the sensor data merging process and by a data management process identify redundantly forwarded information by the data marking, and
  controlling, by the controller of the vehicle sensor system, a safety system of the vehicle by controlling an application of the safety system based on the environment model and/or data output from the data management process.

2. The method as claimed in claim 1, wherein at least one component of the communication data is supplied both to the sensor data merging process and to a data management process by the preprocessing process.

3. The method as claimed in claim 1, wherein different data formats of received vehicle-to-X messages are standardized in a data arrival process.

4. The method as claimed in claim 3, wherein the communication data are combined to produce a joint data stream by means of the data arrival process and/or the preprocessing process.

5. The method as claimed in claim 3, wherein at least one preprocessing stage , which is affiliated to the data arrival process and an ambient data capture process, is used to effect first filtering of the ambient sensor data and the communication data.

6. The method as claimed in claim 5, wherein the preprocessing process is used to effect second filtering of the communication data.

7. The method as claimed in claim 1, wherein the communication data selected by the preprocessing process are selected on the basis of their header data elements.

8. The method as claimed in claim 5, wherein the preprocessing process and the at least one preprocessing stage are used to categorize the ambient sensor data and the communication data into one of the categories critical, relevant and irrelevant.

9. The method as claimed in claim 8, wherein ambient sensor data and communication data categorized as critical are edited and/or forwarded preferentially.

10. The method as claimed in claim 8, wherein ambient sensor data and communication data categorized as irrelevant are rejected.

11. The method as claimed in claim 1, wherein the vehicle-to-X communication means exchange the vehicle-to-X messages using at least one of the following connection types:
  a WLAN connection, based on IEEE 802.11p,
  a WiFi Direct,
  an ISM (Industrial, Scientific, Medical band) connection, using a closing apparatus with radio connection capability,
  a Bluetooth connection
  a ZigBee connection
  a UWB (Ultra Wide Band) connection,
  a WiMax (Worldwide Interoperability for Microwave Access),
  a remote keyless entry connection,
  a closing apparatus with radio connection capability, a mobile radio connection, utilizing GSM, GPRS, EDGE, UMTS and/or LTE connections, and
an infrared connection.

12. The method as claimed in claim 1, wherein, the ambient sensors are one or more elements selected from the group consisting of:
   a radar sensor,
   an optical camera sensor,
   a lidar sensor,
   a laser sensor,
   an ultrasonic sensor
   an ESP sensor,
   an ABS sensor and
   an inclination sensor.

13. A vehicle sensor system for merging ambient sensor data with communication data, the vehicle sensor system comprising:
   ambient sensors in the vehicle for capturing the ambient sensor data;
   a vehicle-to-X communication means in the vehicle for receiving the communication data; and
   a controller, which during a preprocessing process selects:
      a first portion of the communication data and supplies the first portion of the communication data directly to a sensor data merging process that merges the selected communication data with the ambient sensor data to produce an environment model, and
      a second portion of the communication data, and supplies the second portion of the communication data to a data management process,
   wherein the selected communication data including at least one of the first portion or the second portion are provided with a data marking by the preprocessing process,
   wherein heterogeneous application processes that receive information forwarded both by the sensor data merging process and by a data management process identify redundantly forwarded information by the data marking, and
   controlling, by the controller of the vehicle sensor system, a safety system of the vehicle by controlling an application of the safety system based on the environment model and/or data output from the data management process.

14. The use of the system as claimed in claim 13 in a motor vehicle.

* * * * *